United States Patent
De Ponnat et al.

(10) Patent No.: US 7,159,511 B2
(45) Date of Patent: Jan. 9, 2007

(54) METHOD OF MANUFACTURING PRINT BELTS

(75) Inventors: Arnaud De Ponnat, St-Amand Montrond (FR); Mickael Bernou, Parthenay (FR); Damien Leleu, La Grandville (FR); Faye Renaud, St. Georges du Bois (FR)

(73) Assignee: Chevrillon-Philippe Industrie (FR)

( * ) Notice: Subject to any disclaimer, the term of this patent is extended or adjusted under 35 U.S.C. 154(b) by 181 days.

(21) Appl. No.: 10/456,791

(22) Filed: Jun. 6, 2003

(65) Prior Publication Data

US 2004/0043336 A1 Mar. 4, 2004

(30) Foreign Application Priority Data

Jun. 7, 2002 (FR) .................................. 02 07031

(51) Int. Cl.
*G03F 7/26* (2006.01)

(52) U.S. Cl. ............... 101/111; 101/219; 430/270.1; 430/281.1; 430/286.1; 430/302; 430/306; 430/309; 430/434; 430/494

(58) Field of Classification Search .......... 430/270.1, 430/281.1, 286.1, 302, 306, 309, 434, 494; 101/111, 219

See application file for complete search history.

(56) References Cited

U.S. PATENT DOCUMENTS

| | | | |
|---|---|---|---|
| 4,410,562 A | 10/1983 | Nemoto et al. | 427/54.1 |
| 4,411,982 A | 10/1983 | Shibuya et al. | 430/314 |
| 4,535,694 A | 8/1985 | Fukuda | 101/395 |
| 5,233,918 A * | 8/1993 | Hale | 101/122 |
| 5,373,788 A * | 12/1994 | Schoen | 101/219 |
| 5,983,789 A * | 11/1999 | Fogle | 101/111 |
| 6,489,447 B1 * | 12/2002 | Basey et al. | 101/111 |
| 2001/0006703 A1* | 7/2001 | Lynch et al. | 427/163.2 |
| 2004/0052557 A1* | 3/2004 | Fukuta et al. | 399/345 |
| 2004/0259033 A1* | 12/2004 | Kunita | 430/300 |

FOREIGN PATENT DOCUMENTS

| | | |
|---|---|---|
| EP | 1038670 | 9/2000 |
| JP | 2000275862 | 10/2000 |
| JP | 2001188354 | 7/2001 |

* cited by examiner

*Primary Examiner*—Barbara L. Gilliam
(74) *Attorney, Agent, or Firm*—Fish & Richardson P.C.; Richard P. Gilly (57) ABSTRACT

A manufacturing line for manufacturing a print belt comprising a support-forming strip and a photopolymerized resin forming printing characters, the line comprises spreader means adapted to spread the resin on the strip, photopolymerizer means adapted to solidify that portion of the resin that is to correspond to the printing characters, remover means adapted to remove the non-photopolymerized resin from the strip, and drive means adapted to drive the strip in translation in such a manner that each of its transverse sections passes in succession in register with the spreader means, the photopolymerizer means, and the remover means.

23 Claims, 4 Drawing Sheets

METHOD OF MANUFACTURING PRINT BELTS

The present invention relates to a method of manufacturing print belts suitable for use in particular in letterpress or flexographic printing, and it also relates to a line for manufacturing such belts.

BACKGROUND OF THE INVENTION

A print belt concerned by the present invention is of the type comprising a support-forming strip (e.g. made of polyester), and a polymerized resin adhering to one face of the strip and forming printing characters.

Such a belt is used in letterpress or flexographic printing: it is placed as a closed loop around two rollers and it is rotated by them. A strip of paper (or the equivalent) for printing is pressed against the ink-impregnated printing characters.

A known method of manufacturing such belts is of the type comprising: a spreading step during which the liquid resin is spread over a flat surface; a photopolymerizing step during which only that portion of the resin which is to correspond to the printing characters is subjected to exposure to light so as to be solidified; and a removing step during which the non-photopolymerized resin is removed from the surface on which it has been spread.

In such a method, the liquid resin is spread over a plane sheet, it is then exposed to ultraviolet (UV) light, with a film forming the negative of the characters for printing being placed in the immediate vicinity of the resin, between the light source and the sheet. By means of such exposure, only that portion of the resin which is not hidden by the negative film (the portion which is to form the printing characters) is photopolymerized (and solidified). Once photopolymerization has been achieved, the non-photopolymerized liquid resin is removed from the sheet and the sheet is stuck to the support-forming strip.

The problem with such a method is the relatively long time required to implement it.

A previously-proposed solution is to arrange the pages in the negative in such a manner as to be able to place a maximum number of pages in a negative film, thereby reducing the number of sheets used. Consequently, once the non-polymerized resin has been removed from the sheet, the sheet needs to be cut up so as to separate the pages from one another, and then the pages of characters need to be stuck to the support-forming strip in an arrangement suitable for printing the book. Nevertheless, that method presents as a main drawback the need for a large amount of time to cut up and arrange the pages.

OBJECTS AND SUMMARY OF THE INVENTION

An object of the present invention is thus to provide a method of manufacture that is faster and less expensive.

According to the invention, during the spreading step of the manufacturing method of the above-specified type, the liquid resin is spread directly onto the top face of the support-forming strip while it is disposed horizontally, and the support-forming strip is mounted to move longitudinally in translation in such a manner that each transverse section of the support-forming strip passes successively from means enabling one manufacturing step to be performed to means enabling another step to be performed.

The invention also provides the line for manufacturing a belt of the above-specified type.

As mentioned above, a conventional manufacturing line comprises: spreader means adapted to spread the liquid resin, photopolymerizer means adapted to solidify that portion of the resin that is to correspond to the printing characters, and remover means adapted to remove the non-photopolymerized resin from the surface on which it has been spread.

According to the invention, the spreader means are adapted to spread the resin directly on the top face of the support-forming strip, the photopolymerizer means are disposed downstream from the spreader means and comprise a photopolymerizing light source disposed above the resin, the remover means are disposed downstream from the photopolymerizer means, and drive means are adapted to drive the support-forming strip in translation in a longitudinal direction in such a manner that each of its transverse sections passes in succession in register with the spreader means, the photopolymerizer means, and the remover means.

Such a method and such a manufacturing line thus enable the costs of manufacturing a print belt to be reduced significantly, even though the arrangement of the pages of the book for printing during the photopolymerizing step must correspond to the arrangement on the finished print belt.

BRIEF DESCRIPTION OF THE DRAWINGS

Other advantages and details appear in the following description.

In the accompanying drawings, given purely by way of non-limiting example.

MORE DETAILED DESCRIPTION

Figure 1:
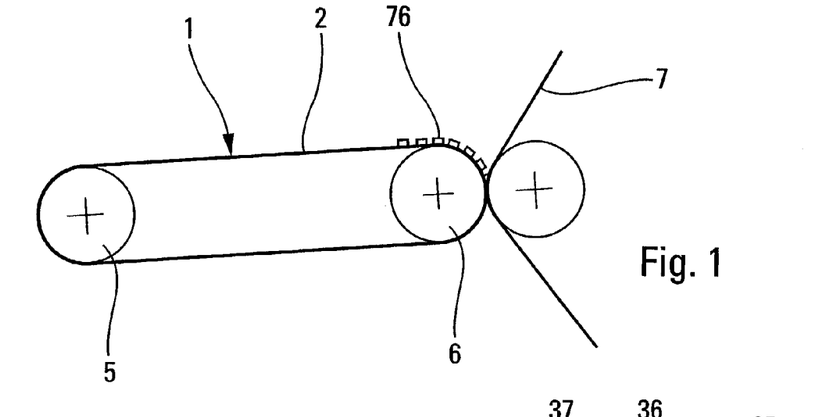
FIG. 1 is a simplified section view of a print belt used in an industrial printworks.

A print belt 1 concerned by the present invention comprises a support-forming strip 2 and polymerized resin 3 fixed on one face 4 of the support-forming strip 2 and forming printing characters 76.

As can be seen in FIG. 1, such a print belt 1 is used in industrial printworks for letterpress or flexographic printing: the print belt 1 is disposed as a closed loop around two drive rollers 5 and 6 and it is driven in rotation by them. Printing is performed on a strip of paper 7 for printing by bringing said strip of paper for printing 7 into contact under pressure against printing characters 76 that have been impregnated with ink.

Figure 2A:
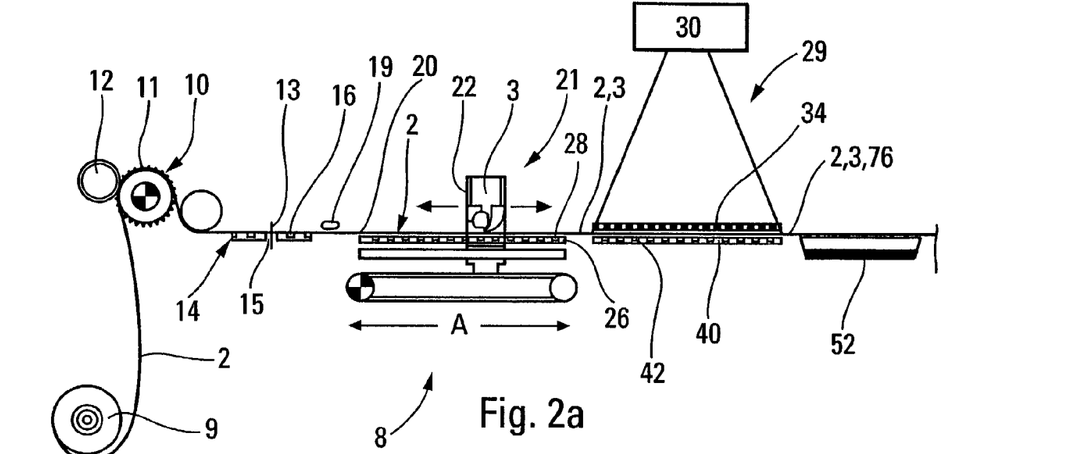
FIGS. 2a, 2b, and 2c are longitudinal section views of a manufacturing line of the invention.
Figure 2B:
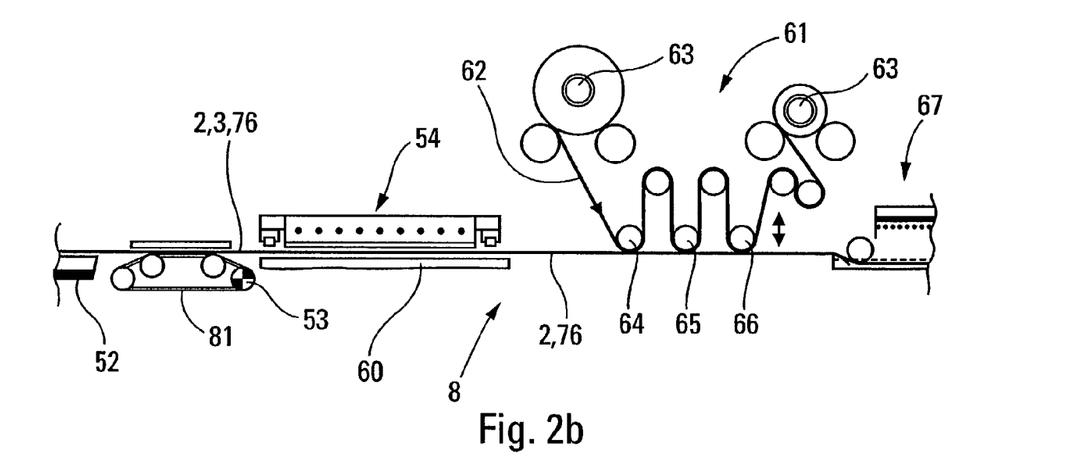
Figure 2C:
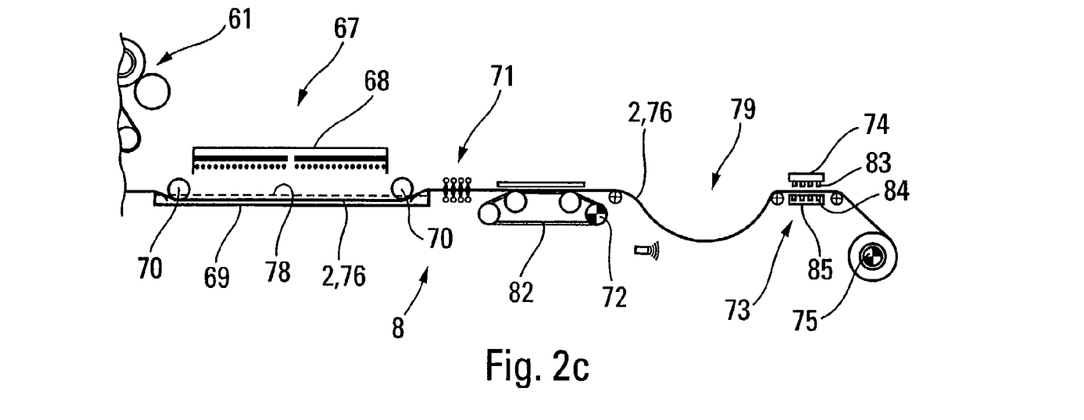

FIG. 2 shows a particular example of a manufacturing line 8 in accordance with the present invention.

The manufacturing line 8 comprises, at its upstream end, an unrolling roller 9 for delivering the support-forming strip.

The unrolling roller 9 is mounted to rotate, and strip is taken from it as required during manufacture of the print belt 1.

The support-forming strip 2 has perforations along each of its side margins.

Downstream from the unrolling roller 9, the manufacturing line 8 has a first pair of drive rollers 10 forming drive means, each of the drive rollers 10 being disposed in register with the perforations in the support-forming strip 2. These first drive rollers 10 are provided along their peripheries with pegs 11 that engage with the perforations in the support-forming strip 2, enabling it to be driven from upstream to downstream along the manufacturing line 8.

In order to ensure that the support-forming strip 2 is properly driven, a pair of presser wheels 12, each having a peripheral groove, press the strip against the first drive rollers 10. The pegs 11 in each first drive roller 10 are received in a groove formed in the periphery of the corresponding presser wheel 12.

In order to accept support-forming strips 2 of different widths, a first drive roller 10 and the corresponding presser wheel 12 are mounted to be movable in translation along their respective axes of rotation. In order to enable the moving drive roller 10 to be rotated, its rotary shaft is fluted.

Downstream from the first pair of drive rollers 10, the manufacturing line 8 has cutter means adapted to cut the support-forming strip 2 when it is stationary.

The cutter means comprise a cutter blade 13 mounted to be movable in translation in the direction across the support-forming strip 2.

At the cutter blade 13, the support-forming strip 2 is placed on a first slab 14. The first slab 14 is split in the longitudinal direction by a transverse slot 15 in which the cutter blade 13 is adapted to slide. The first slab 14 also has a series of suction grooves 16 opening out into the surface on which the support-forming strip 2 rests. These suction grooves 16 are connected to a vacuum pump, thus serving to press the support-forming strip 2 down so as to ensure that the support-forming strip 2 is cut very accurately.

Downstream from the cutter means, the manufacturing line 8 has dust-remover means.

The dust-remover means comprise an electrostatic brush 19 mounted in the immediate vicinity of the top face 20 of the support-forming strip 2 and adapted to remove therefrom any dust incompatible with very precise and regular spreading of the resin 3.

The dust-removing step takes place while the support-forming strip 2 is moving.

Downstream from the electrostatic brush 19, the manufacturing line 8 has spreader means 21 adapted to spread the resin 3 directly on the top face 20 of the support-forming strip 2, and over practically its entire width. The spreader means 21 are movable relative to the support-forming strip 2.

Figure 3:
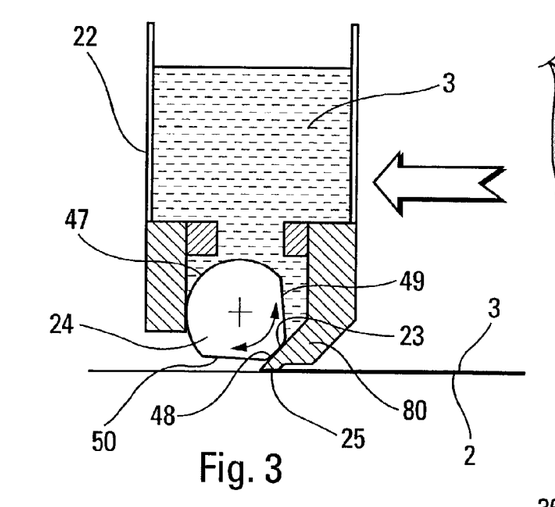
FIG. 3 is a longitudinal section view of spreader means.

The spreader means 21 comprise a vessel 22 suitable for containing the resin 3, and regulator means adapted to regulate the temperature and consequently the viscosity of the liquid resin 3. In its bottom portion, the vessel 22 has an opening 23 and a moving plug 24 turnable between a closed position and an open position in which the resin 3 can flow out through the opening 23. The opening 23 is constituted by the gap that exists between the pivot axis of the brush 24 and a wall 80 of the vessel 22.

The vessel 22 also has a scraper element 25 disposed beneath the opening 23 and the rotary plug 24, in line with the wall 80. The spreader means 21 are movable in the longitudinal direction over a maximum amplitude of translation A, the scraper element 25 being placed downstream from the opening 23 so as to be capable of leveling the resin 3 that has just been delivered. The opening 23 of the vessel 22 extends in the transverse direction, perpendicular to the longitudinal direction.

In order to accept support-forming strips 2 of different widths, the spreader means 21 include adjustment means adapted to adjust the size of the opening 23 in the transverse direction.

In the particular example shown in FIGS. 2 and 3, the rotary plug 24 is adapted to spread the resin 3 in two different widths, as a function of the width of the support-forming strip 2. In cross-section, the rotary plug 24 comprises two circular arcs 47 and 48, and between these two circular arcs 47 and 48 it has two rectilinear segments 49 and 50. The plug is in its closed position when one of its circular arcs 47, 48 is in the opening 23 (and tangential to the wall 80), and it is in its open position when one of its segments 49, 50 is in register with the opening 23.

The two circular arcs 47 and 48 and the two segments 49 and 50 extend in the transverse direction, with one of the two segments extending beyond the other, the short segment then being replaced by an additional circular arc uniting the other two circular arcs 47 and 48.

In the spreader means 21, the support-forming strip 2 is placed on a second slab 26 having a surface on which the support-forming strip 2 rests that is particularly flat, and provided with a series of suction grooves 28 opening out therein and connected to a vacuum pump. The second slab 26 also includes temperature regulator means.

The temperature regulator means (both those of the vessel 22 and those of the second slab 26), the flatness of the second slab 26, and the presence of the scraper element 25 co-operate to enable the resin 3 to be spread over a thickness that is constant and precise, for example a thickness of 530 micrometers (µm) with precision of 20 µm.

The spreading step is performed when the support-forming strip 2 is stationary, the spreader means 21 then moving from their downstream position to their upstream position.

Figure 4:
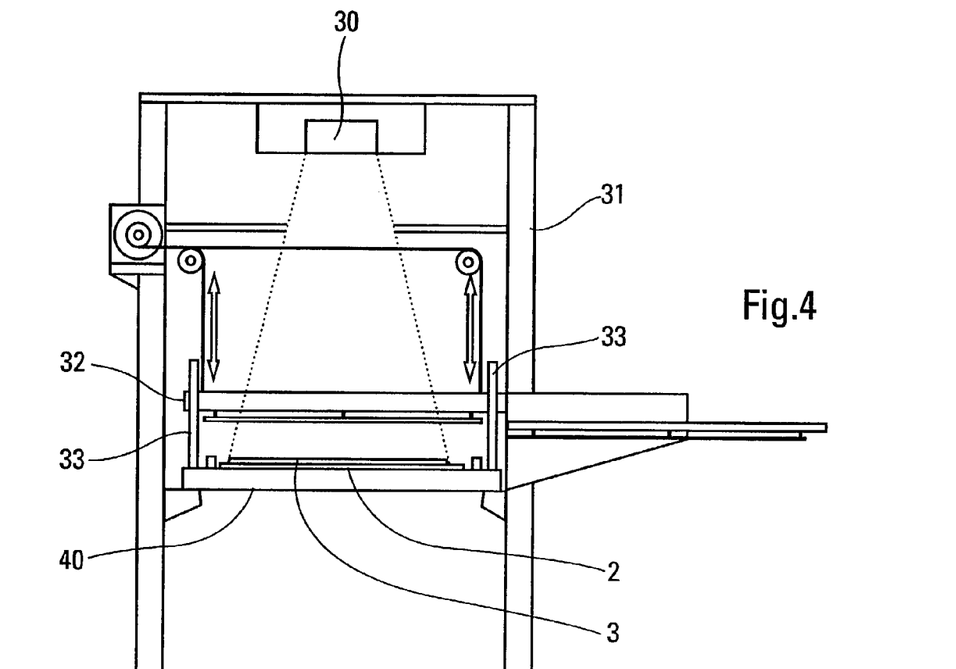
FIG. 4 is a cross-section view of photopolymerizer means.

Downstream from the spreader means 21, the manufacturing line 8 has photopolymerizer means 29 adapted to solidify that portion of the resin 3 that is to correspond to the printing characters 76.

The photopolymerizer means 29 comprise a photopolymerizer light source 30 disposed above the support-forming strip 2. They also comprise a structure 31 disposed astride the support-forming strip 2 and having the photopolymerizer light source 30 (UV light) fixed thereto.

The structure 31 is adapted to support in a fixed position a negative film 34 of the characters that are to be printed, which film is transparent to the light emitted by the photopolymerizer light source 30 solely in the locations occupied by the characters.

The structure 31 comprises a main frame 32 disposed between the light source 30 and the resin 3. The main frame 32 is vertically movable between a high position and a low position closer to the resin, and it is guided by guide columns 33. The main frame 32 is removable: it can be raised above the top ends of the guide columns 33 and separated from the structure 31.

Figure 5:
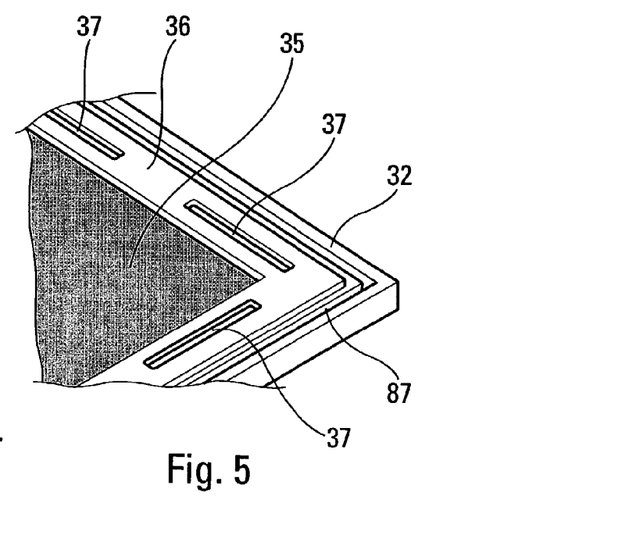
FIG. 5 is a perspective view of a support frame of photopolymerizer means.
Figure 6:
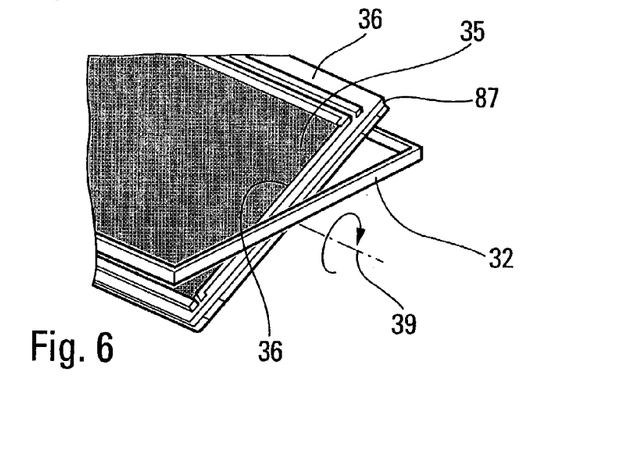
FIG. 6 is another perspective view of the support frame.

The negative film 34 is placed on a window 35 that is transparent to the light emitted by the photopolymerizer light source 30 and it is surrounded by a support frame 36, the window 35 being fixed relative to the support frame 36. The support frame 36 includes a series of suction grooves 37 opening out in the surface against the negative film 34 is placed. These suction grooves 37 enable the negative film 34 to be placed in as flat as possible a manner on the window 35 without leaving any bubbles of air between the window 35 and the negative film 34 which would deform the resin characters. A first position-identifying system enables the negative film 34 to be positioned very precisely relative to the support frame 36.

The support frame 36 is mounted to move relative to an intermediate frame 87 which surrounds it, and the intermediate frame 87 is mounted to move relative to the main frame 32 which surrounds it.

A second position-identifying system serves to enable the support frame 36 to be positioned very precisely in both the longitudinal and transverse directions relative to the support-forming strip 2 without having constraints relating to the precision of the longitudinal and transverse position of the support frame 32. This second position-identifying system comprises studs 44 fixed on a third slab 40 on which the support-forming strip 2 rests in register with the photopolymerizer means 29, the studs being on either side of the support-forming strip 2. In addition, the support frame 36 has openings 45 adapted to receive the studs 44. The studs 44 and the openings 45 enable the support frame 36 to occupy a well-defined position in spite of any slack between the support frame 36 and the intermediate frame 87, between the intermediate frame 87 and the main frame 32, and between the main frame 32 and the guide columns 33.

While photopolymerization is taking place, the negative film 34 is placed in the immediate vicinity of the resin 3 in such a manner that the characters to be reproduced on the resin 3 are not deformed by light diffusing.

The support frame 36 is mounted to move in translation in the vertical direction relative to the intermediate frame 87 and it has abutment elements 46 disposed on the surface against which the negative film 34 is placed. These abutment elements 46 are adapted to come into abutment against the top surface of the third slab 40. It is thus possible to define very precisely the distance between the negative film 34 and the resin 3 without the vertical position of the intermediate frame 87 (and of the main frame 32) having the same precision, given the amplitude of the vertical movement of the connection means 86 connecting the support frame 36 to the intermediate frame 87.

Figure 7:
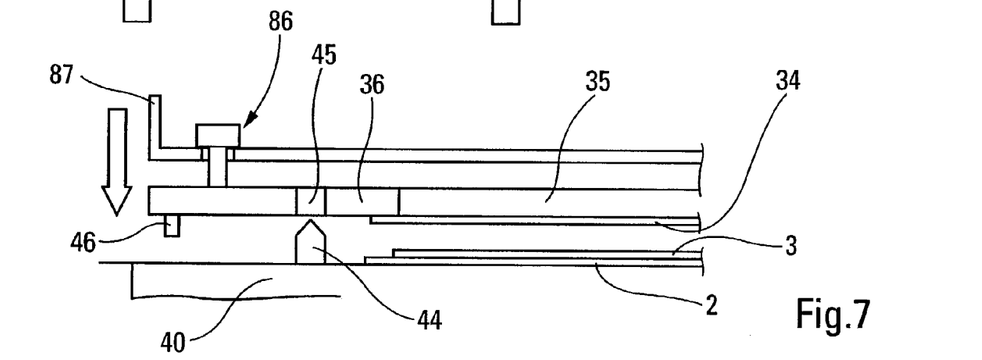
FIG. 7 is a section view showing the arrangement of a main frame of photopolymerizer means prior to being put into its low position.
Figure 8:
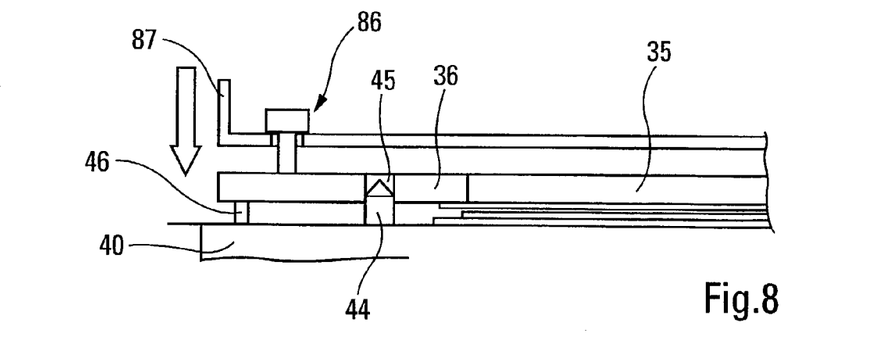
FIG. 8 is a view similar to FIG. 7, the main frame being in its low position.

In order to minimize the distance between the negative film 34 and the resin 3, the intermediate frame 87 is mounted to move about a pivot axis 39 relative to the main frame 32 in such a manner that the face of the window 35 against which the negative film 34 is pressed is the face which is closest to the resin 3 (FIGS. 7 and 8).

The third slab 40 has a top surface which is particularly flat, and provided with a series of suction grooves 42 connected to a vacuum pump, enabling the support-forming strip 2 and the liquid resin 3 previously leveled by the scraper element 25 themselves to be particularly flat.

During the photopolymerizing step, the support-forming strip 2 is stationary. Once the portion of the resin situated in register with the negative film 34 has been photopolymerized, the support-forming strip 2 is moved in the downstream direction through a distance equal to one advance step.

The size of the character-bearing zone of the negative film 34 in the transverse direction is slightly smaller than the width of the resin 3 spread on the support-forming strip 2, and its size in the longitudinal direction is slightly shorter than the advance step.

The amplitude of the movement in translation of the spreader means 21 is matched to the negative film 34 and is equal to the advance step so that the junction between two successive sheets of resin 3 is as narrow as possible. In the example shown, the downstream position of the spreader means 21 is distant from the upstream end from the zone of the support-forming strip 2 that is exposed to the photopolymerizer light source 30 by a distance equal to one advance step, such that the junction zone occurs not in register with the negative film 34, but in register with the assembly formed by the support frame 36 and the main frame 32 (the maximum amplitude A for displacement of the spreader means 21 is considerably greater than the advance step).

Downstream from the photopolymerizer means 29, the manufacturing line 8 has back exposure means.

The back exposure means comprise a back exposure light source 52 placed beneath the support-forming strip 2. The back exposure light source is adapted to polymerize the layer of resin 3 closest to the support-forming strip 2, the support-forming strip 2 being at least partially transparent to the light from the back exposure light source 52. The back exposure step serves to fix onto the support-forming strip 2 the printing characters 76 made during the photopolymerizing step.

The back exposure step takes place while the support-forming strip is moving.

Downstream from the back exposure means 52, the manufacturing line 8 has a second pair of drive rollers 53 which drive a first pair of belts 81 provided with pegs forming drive means.

The first and second pairs of drive rollers 10 and 53 enable the support-forming strip 2 to have a high level of tension imparted thereto (thus making it very flat) during the stages of spreading, photopolymerization, and back exposure.

Figure 9:
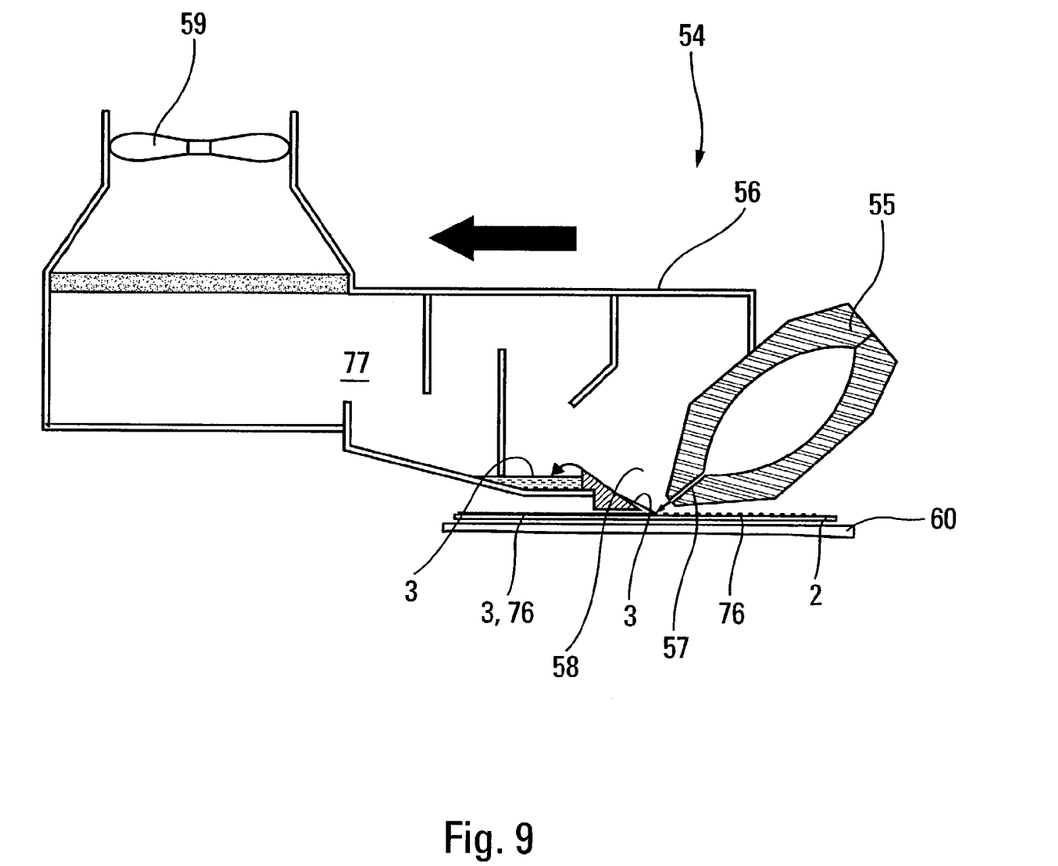
FIG. 9 is a cross-section view of remover means.

Downstream from the second pair of drive rollers 53, the manufacturing line 8 has remover means 54 adapted to remove the non-photopolymerized resin 3 from the support-forming strip 2.

The remover means 34 comprise an air blower device 55 propelling air towards the liquid and the solidified resin 3, and a recovery unit 56 for recovering the liquid resin 3.

The recovery unit 56 is placed facing the blower device 55 in the blow direction. In this way, the liquid resin 3 is detached from the printing characters 76 and the support-forming strip 2 by the air, and it is entrained into the recovery unit 56. The recovery unit 56 is placed very close to the resin 3 so as to minimize the quantity of liquid resin 3 that passes between the recovery unit 56 and the support-forming strip 2. In addition, the recovery unit 56 comprises an enclosure 77 with an opening 58 for receiving the liquid resin 3 disposed in the bottom portion of the enclosure 77, and suction means 59 suitable for sucking in the vapor from the recovered resin 3 so as to prevent a mist of resin 3 forming outside the enclosure 77.

The remover means 54 are movable in the transverse direction, the removing step being performed while the support-forming strip 2 is stationary. The blower device 55 has a blow slot 57 extending along the longitudinal direction over a length that is slightly longer than the advance step so as to remove all of the resin in a single pass.

The air that is blown and a fourth slab 60 on which the support-forming strip 2 is placed in the remover means 54 are preferably heated so as to increase the fluidity of the liquid resin 3.

Downstream from the remover means 54, the manufacturing line 8 has cleaner means 61 adapted to remove any traces of liquid resin 3 that might have remained stuck to the surfaces of the printing characters 76.

The cleaner means 61 comprise a cleaner strip 62 that is movable in translation in the longitudinal direction, having a width that is not less the width of the support-forming strip 2, and each longitudinal end of which is fixed to a storage cylinder 63. The cleaner strip 62 is pressed against the printing characters by three presser rollers 64, 65, and 66 in succession that are allowed to rotate freely.

The cleaning step is performed while the support-forming strip 2 is moving, the cleaner strip 62 blotting the surfaces of the characters at the three presser rollers 64, 65, and 66.

In the example, the three presser rollers 64, 65, and 66 are vertically movable between a low position in which they press the cleaner strip 62 against the printing characters 76, and a high position.

Downstream from the cleaner means 61, the manufacturing line 8 has post-exposure means 67 adapted to cause the printing characters to harden.

The post-exposure means comprise a post-exposure light source 68 disposed over the support-forming strip 2.

The post-exposure means 67 also comprise a trough 69 filled with water 78, the support-forming strip 2 being directed therethrough by two pairs of wheels 70 that are mounted to rotate freely and that are placed in the vicinity of the margins of the support-forming strip 2 so as to avoid spoiling the printing characters 76. The use of such a trough 69 is particularly well adapted to certain resins whose polymerization can be impeded by the presence of oxygen, and water can be replaced by any other liquid so as to implement anaerobic post-exposure.

One wheel in each pair of wheels 70 is mounted to be capable of moving in translation along its axis of rotation so as to accept support-forming strips 2 of different widths.

The post-exposure step takes place while the support-forming strip 2 is moving.

Downstream from the post-exposure means 67, the manufacturing line 8 has drier means 71 adapted to dry the support-forming strip 2 leaving the trough 69.

These drier means 71 may comprise a plurality of strips expelling hot air.

Downstream from the drier means 71, the manufacturing line 8 has a third pair of drive rollers 72 which drives a second pair of belts 82 provided with pegs that form drive means.

These third drive rollers 72 are similar to the second drive rollers 53. The second and third pairs of drive rollers 53 and 72 serve to impart tension to the support-forming strip 2 that is lower than the tension which is imparted thereto between the first and second pairs of drive rollers 10 and 53 so as to avoid spoiling the printing characters 76, in particular while the support-forming strip 2 is being guided through the trough 69.

Downstream from the third pair of drive rollers 72, the manufacturing line 8 has stop means 73 adapted to hold the portion of the support-forming strip 2 that is fixed therein stationary, while allowing the portion that lies upstream therefrom free to move.

These stop means 73 comprise a pair of combs 74 in which each tooth 83 is adapted to pass through the lateral perforations of the support-forming strip 2 and to penetrate into holes 84 formed in the top surface of a fifth slab 85 on which the support-forming strip 2 rests, thereby holding the support-forming strip 2 stationary relative to its longitudinal advance axis. These stop means 73 are particularly suitable when a single support-forming strip 2 is used as a support for printing characters 76 for a plurality of print belts 1.

Downstream from the stop means 73, the manufacturing line 8 has a receiver roller 75 mounted to rotate and adapted to receive the support-forming strip 2 carrying the printing characters 76.

The method of manufacturing the print belt 1 performed in the manufacturing line 8 shown in FIG. 2 comprises a succession of stationary periods during which the support-forming strip 2 is stationary, and movement periods during the support-forming strip 2 is moved by the drive means 10, 53, 72 through a distance equal to one advance step so that each transverse section of the support-forming strip 2 is subjected to the various steps of the manufacturing method.

The dust removing, back exposure, cleaning, post-exposure, and drying steps are performed during periods of movement, while the spreading, photopolymerizing, and resin removing steps are performed during stationary periods.

During periods of movement, the main frame 32 is put in its high position and is replaced by a main frame 32 fitted with a new negative film 34 which is put into the low position and which is positioned with precision relative to the support-forming strip 2, the remover means 54 being moved transversely towards their beginning-of-cycle position without air being blown, and the cleaner strip 62 being moved in the same direction as the support-forming strip 2, the presser rollers 64, 65, and 66 being in their low position.

During stationary periods, the spreader means 21 are moved longitudinally from their upstream position close to the dust-remover means 19 towards their downstream position close to the photopolymerizer means 29, the opening 23 in the vessel 22 then being closed, after which they are moved longitudinally from their downstream position to their upstream position with the opening 23 of the vessel 22 being open, the next negative film 34 is fixed to a support frame 36 that is separated from the structure 31, the remover means 54 are moved transversely while air is being blown, the presser rollers 64, 65, and 66 are moved to their high position, the cleaner strip 62 is then unrolled in the upstream to downstream direction through a length that is sufficient for the entire area thereof that has been in contact with the printing characters 76 to be located downstream from the downstream presser roller 66, and the presser rollers 64, 65, and 66 are moved from their high position to their low position.

When the support-forming strip 2 is used for a plurality of print belts 1, the last characters of the first print belt 1 may be separated from the first characters of the second print belt 1 by only two advance steps so that the spreader means 21 and the photopolymerizer means 29 remain in phase. It is then possible, when the last characters of the first print belt 1 are downstream from the stop means 73, to stop the movement of the receiver roller 75 independently from the remainder of the manufacturing line 8 (the second print belt 1 that continues to be manufactured then accumulating in a buffer zone 79 between the stop means 73 and the third pair of drive rollers 72), to fix the end of the second print belt 1 to the stop means 73, to cut the support-forming strip 2, and thus to separate the two print belts, to replace the first receiver roller 75, and to fix the free end of the second print belt 2 to the new receiver roller 75.

Naturally, the present invention is not limited to the embodiment described above in detail.

The above-described spreader means 21 may be replaced by equivalent means, they may be mounted so as to move transversely or they may be stationary, in which case the spreading step is performed where the support-forming strip 2 is moving.

The photopolymerizer means 29 described above may be replaced by equivalent means, for example by numerically controlled laser radiation sources enabling the support-forming strip 2 to move continuously without stationary periods.

The back exposure light source 52 may be movably mounted so that the back exposure step can take place while the support-forming strip 2 is stationary.

The above-described remover means 54 may be replaced by equivalent means, they may be mounted to move longitudinally or they may be stationary, the removing step then taking place while the support-forming strip 2 is moving.

The above-described cleaner means 61 may be replaced by equivalent means, they may be movable, with the cleaning step then being performed while the support-forming strip 2 is stationary.

The above-described post-exposure means 67 may be replaced by equivalent means, it is possible to omit the trough 69 depending on the type of resin used, the post-exposure light source 68 possibly being movable, in which case the post-exposure step can be performed while the support-forming strip 2 is stationary.

The above-described drier means 71 may be replaced by equivalent means, they may be movably mounted so that the drying step can be performed while the support-forming strip 2 is stationary.

In addition, such a manufacturing line 8 with all of its steps can be used to manufacture print belts of very high quality. It is possible to omit the dust-remover means 19, the back exposure means 52, the cleaner means 61, the post-exposure means 67, the drier means 71, or some of them only. It is also possible to avoid imparting different degrees of tension to the support-forming strip 2 in different positions along the manufacturing line 8. It is also possible to omit the cutter blade 13 and/or the stop means 73.

What is claimed is:

1. A manufacturing line for manufacturing a print belt comprising a support-forming strip, and a photopolymerized resin placed on one of the faces of the support-forming strip and forming printing characters, the manufacturing line comprising spreader means adapted to spread a liquid resin, photopolymerizer means adapted to solidify that portion of the resin that is to correspond to the printing characters, and remover means adapted to remove the non-photopolymerized resin from the surface on which it has been spread;

wherein the spreader means are adapted to spread the resin directly on the top face of the support-forming strip, wherein the spreader means comprise temperature regulator means, adapted to regulate the temperature and the viscosity of the liquid resin, or wherein, in the spreader means, a slab supporting the support-forming strip comprises temperature regulator means, or wherein both the slab supporting the support-forming strip and the spreader means comprise temperature regulator means;

wherein the photopolymerizer means are disposed downstream from the spreader means and comprise a photopolymerizing light source disposed above the resin;

wherein the remover means are disposed downstream from the photopolymerizer means; and wherein drive means are adapted to drive the support-forming strip in translation in a longitudinal direction in such a manner that each of its transverse sections passes in succession in register with the spreader means, the photopolymerizer means, and the remover means.

2. A manufacturing line according to claim 1, including back exposure means disposed downstream from the photopolymerizer means and upstream from the remover means, said back exposure means comprising a back exposure light source disposed beneath the support-forming strip and adapted to polymerize the layer of resin closest to the support-forming strip in such a manner as to fix the printing characters to the support-forming strip.

3. A manufacturing line according to claim 1, including cleaner means disposed downstream from the remover means and adapted to remove traces of liquid resin that have been remained stuck to the surfaces of the printing characters.

4. A manufacturing line according to claim 1, including post-exposure means adapted to harden the printing characters and disposed downstream from the remover means, the post-exposure means comprising a post-exposure light source disposed above the support-forming strip.

5. A manufacturing line according to claim 4, wherein the post-exposure means comprise a trough filled with a liquid situated in register with the post-exposure light source and through which the support-forming strip is directed so that the photopolymerization of the surface of the printing characters during the post-exposure step is performed in an anaerobic medium.

6. A manufacturing line according to claim 5, including drier means downstream from the trough.

7. A manufacturing line according to claim 1, including dust-remover means disposed upstream from the spreader means and adapted to remove all dust form the top face of the support-forming strip.

8. A manufacturing line according to claim 1, including an unrolling roller at its upstream end, the support-forming strip being taken therefrom.

9. A manufacturing line according to claim 1, including, at its downstream end, a receiver roller receiving the support-forming strip provided with printing characters.

10. A manufacturing line according to claim 1, wherein the photopolymerizer means comprise a structure having removably and movably mounted thereon a mask-forming element constituting the negative of the characters to be made, disposed between the light source and the resin in the immediate vicinity of the resin.

11. A manufacturing line according to claim 1, wherein the spreader means are movable in the longitudinal direction.

12. A manufacturing line according to claim 1, wherein the spreader means comprise a vessel adapted to contain the liquid resin and including, in its bottom portion, an opening with a rotary plug turnable between a closed position and an open position in which the resin can flow out through the opening.

13. A manufacturing line according to claim 12, the line being adapted to receive support-forming strips of different widths, and wherein the plug comprises, in cross-section, two circular arcs tangential to a wall of the vessel defining the spreader opening, and between said two circular arcs, two segments, one of the two segments extending beyond the other segment in the direction along the axis of rotation of the plug so as to define two spreader widths.

14. A manufacturing line according to claim 1, wherein the spreader means comprise a scraper element adapted to level the resin spread on the support-forming strip.

15. A manufacturing line according to claim 1, wherein the remover means comprise an air blower device adapted to propel air towards the liquid and solidified resin, and a recovery unit for receiving the liquid resin that is detached from the support-forming strip by the propelled air, the recovery unit being placed facing the air blower device relative to the blowing direction and in the immediate vicinity of the resin.

16. A manufacturing line according to claim 15, wherein the recovery unit comprises suction means adapted to suck in the vapor from the recovered resin so as to prevent a mist of resin forming outside the recovery unit.

17. A manufacturing line according to claim 1, wherein the remover means are movable transversely.

18. A manufacturing line according to claim 1, wherein the drive means comprise a first pair of drive rollers upstream from the spreader means, a second pair of drive rollers between the photopolymerizer means and the remover means, and a third pair of drive rollers at the end of the manufacturing line, thereby enabling the support-forming strip to have high tension imparted thereto between the first and second pair of drive rollers and lower tension imparted thereto downstream from the second pair of drive rollers.

19. A manufacturing line according to claim 1, the line being adapted to receive support-forming strips of different widths.

20. A manufacturing line according to claim 19, wherein each pair of drive rollers comprises at least one drive roller that is mounted to move in translation along its rotary shaft.

21. A manufacturing line according to claim 1, wherein, in the spreader means, a slab having a top surface on which said support-forming strip rests is provided with a series of suction grooves connected to a vacuum pump.

22. A manufacturing line according to claim 1, wherein, in the photopolymerizer means, a slab having a top surface on which said support-forming strip rests is provided with a series of suction grooves connected to a vacuum pump.

23. A manufacturing line for manufacturing a print belt comprising a support-forming strip, and a photopolymerized resin placed on one of the faces of the support-forming strip and forming printing characters, the manufacturing line comprising spreader means adapted to spread a liquid resin, photopolymerizer means adapted to solidify that portion of the resin that is to correspond to the printing characters, and remover means adapted to remove the non-photopolymerized resin from the surface on which it has been spread;

wherein the spreader means are adapted to spread the resin directly on the top face of the support-forming strip;

wherein, in the photopolymerizer means, or in the spreader means, or in both the photopolymerizer means and the spreader means, a slab having a top surface on which said supporting said support-forming strip rests is provided with a series of suction grooves connected to a vacuum pump;

wherein the photopolymerizer means are disposed downstream from the spreader means and comprise a photopolymerizing light source disposed above the resin;

wherein the remover means are disposed downstream from the photopolymerizer means; and wherein drive means are adapted to drive the support-forming strip in translation in a longitudinal direction in such a manner that each of its transverse sections passes in succession in register with the spreader means, the photopolymerizer means, and the remover means.

* * * * *